United States Patent
Ishida

(10) Patent No.: US 7,318,184 B2
(45) Date of Patent: Jan. 8, 2008

(54) MOBILE TELEPHONE, APPARATUS, METHOD, AND PROGRAM FOR CALCULATING AN INTERLEAVE PARAMETER

(75) Inventor: Kazuhiro Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 578 days.

(21) Appl. No.: 10/921,830

(22) Filed: Aug. 20, 2004

(65) Prior Publication Data

US 2005/0044466 A1    Feb. 24, 2005

(30) Foreign Application Priority Data

Aug. 22, 2003   (JP)   ............... 2003-298493

(51) Int. Cl.
*H03M 13/27*   (2006.01)
(52) U.S. Cl. .................... 714/755
(58) Field of Classification Search ........... 714/755; H03M 13/27
See application file for complete search history.

(56) References Cited

U.S. PATENT DOCUMENTS 6,546,520 B1 *   4/2003   Cameron ........... 714/788

FOREIGN PATENT DOCUMENTS

| EP | 996232 A2 * | 4/2000 |
| EP | 1 195 910 A2 | 4/2002 |
| GB | 2346782 A * | 8/2000 |
| JP | 2003-152551 | 5/2003 |
| WO | WO 2004/025839 A1 | 3/2004 |
| WO | WO 2004/030226 A1 | 4/2004 |

OTHER PUBLICATIONS

Floor and Ceiling Functions; May 9, 2007; Wikipedia, the free encyclopedia; 3 pages; URL: http://en.wikipedia.org/wiki/Floor_function.*
"Prime Interleaver Complexitiy Analysis", TSG-Ran WG-1 meeting #4, Apr. 18, 1999, XP002263149, pp. 1-9.
Stewart Crozier, et al., "High-Performance Low-Memory Interleaver Banks for Turbo-Codes", VTC Fall 2001, IEEE 54th, Vehicular Technology Conference, Preceedings, vol. 1, Oct. 7, 2001, XP010562400, pp. 2394-2398.
Masanao Ise, et al., "System-On-A-Chip Architecture for W-CDMA Baseband Modem LSI", Conference Proceedings Article, Oct. 23, 2001, XP010576786, pp. 364-369.
European Search Report dated Dec. 21, 2004.
3rd Generation Partnership Project; Technical Specification Group Radio Access Network; Multiplexing and channel coding (FDD), 3GPP TS 25.212 v3.10.0, Jun. 2002.

* cited by examiner

*Primary Examiner*—R. Stephen Dildine
(74) *Attorney, Agent, or Firm*—McGinn IP Law Group, PLLC

(57) ABSTRACT

A base sequence $S(j)$ is not directly calculated but is indirectly calculated by the use of a numerical sequence $M(n)=[v \times n] \bmod p$. A value of $M(n)$ can be calculated by a recurrence formula without requiring modulo calculation. The value obtained is stored in a memory. $M(n)$ satisfies $S(j)=M(S(j-1))$. By determining an initial value of $S(j)$ and interleaving the value of $M(n)$ stored in the memory, the base sequence $S(j)$ can be calculated without modulo calculation.

20 Claims, 7 Drawing Sheets

US 7,318,184 B2

MOBILE TELEPHONE, APPARATUS, METHOD, AND PROGRAM FOR CALCULATING AN INTERLEAVE PARAMETER

This application claims priority to prior Japanese application JP 2003-298493.

BACKGROUND OF THE INVENTION

This invention relates to a mobile telephone, an interleave parameter calculating apparatus, an interleave parameter calculating method, and an interleave parameter calculating program each of which requires a reduced amount of calculation upon obtaining a base sequence for intra-row permutation in a turbo code interleaver.

In a turbo code interleaver defined in 3GPP (3rd Generation Partnership Project) TS (Technical Specification) 25.212 ver. 3.10.0 as a standard of IMT2000 (International Mobile Telephony 2000) (W-CDMA (Wideband Code Division Multiple Access)), a base sequence $S(j)$ for intra-row permutation is calculated by the use of a prime number p and an associated primitive root v.

$$S(j)=[v \times S(j-1)] \bmod p,$$

$$j=1, 2, \ldots, (p-2), \text{ and } S(0)=1$$

The base sequence $S(j)$ is calculated through a process illustrated in FIG. 1.

A turbo code was presented by Berrou et al and is characterized in the following respects.

(1) Concatenated coding in which an information sequence and a rearranged or interleaved information sequence interleaved by the interleaver are individually encoded by component encoders and combined into code words.

(2) Iterative decoding in which decoding is iteratively carried out by the use of a decoding result of the other.

Japanese Patent Application Publication (JP-A) No. 2003-152551 focuses upon interleaving by the interleaver and proposes a method of solving a problem in a mobile communication system, i.e., necessity of a large number of interleave patterns so as to meet a wide variety of interleaving lengths.

In a processor used in a mobile telephone or the like, modulo calculation is often carried out digit by digit in order to reduce a circuit scale. Assuming that a data width is equal to 16 bits, 16 unit steps are required for calculation given by:

$$S(j)=S(j) \bmod p \text{ (step S104).}$$

It is assumed that a conditional branch (step S105) requires two unit steps and each of the remaining steps (steps S102 and S103) requires one unit step. Then, in the process illustrated in FIG. 1, 20 unit steps are required in a single loop S(steps S102 to S105).

According to the definition of 3GPP, the prime number p has a maximum value of 257. Therefore, this loop is repeated 255 times at maximum. Therefore, a processing time is disadvantageously increased.

Herein, $S(j)$ is calculated as the base sequence. However, if the number C of columns of the interleaver is equal to p−1, $Sm(j)$ is required instead of $S(j)$.

$$Sm(j)=S(j)-1$$

In this case, another unit step of subtracting 1 from each value of $S(j)$ is required. Consequently, the single loop requires 21 steps.

SUMMARY OF THE INVENTION

It is an object of this invention to provide means for decreasing the number of unit steps in a single loop for calculating a base sequence $S(j)$ or $Sm(j)$ and reducing a processing time.

According to this invention, there is provided a mobile telephone comprising, in order to obtain a base sequence for intra-row permutation in a turbo code interleaver:

calculating means for calculating M(n) represented by:

$$M(n)=[v \times n] \bmod p,$$

where n is a natural number, p is a prime number, and v is an associated primitive root, by the use of:

$$M(n)=M(n-1)+v \text{ (if } M(n-1)+v<p\text{), or}$$

$$M(n)=M(n-1)+v-p \text{ (if } M(n-1)+v \geq p\text{);}$$

first storing means for storing values obtained by the calculating means into a memory;

reading means for reading the values stored in the memory by the first storing means;

interleaving means for interleaving the values read by the reading means; and second storing means for storing a numerical sequence obtained by interleaving by the interleaving means into a memory.

According to this invention, there is also provided an interleave parameter calculating apparatus comprising, in order to obtain a base sequence for intra-row permutation in a turbo code interleaver:

calculating means for calculating M(n) represented by:

$$M(n)=[v \times n] \bmod p,$$

where n is a natural number, p is a prime number, and v is an associated primitive root, by the use of:

$$M(n)=M(n-1)+v \text{ (if } M(n-1)+v<p\text{), or}$$

$$M(n)=M(n-1)+v-p \text{ (if } M(n-1)+v \geq p\text{);}$$

first storing means for storing values obtained by the calculating means into a memory;

reading means for reading the values stored in the memory by the first storing means;

interleaving means for interleaving the values read by the reading means; and second storing means for storing a numerical sequence obtained by interleaving by the interleaving means into a memory.

According to this invention, there is also provided an interleave parameter calculating apparatus comprising, in order to obtain a base sequence for intra-row permutation in a turbo code interleaver:

calculating means for calculating M(n) represented by:

$$M(n)=[v \times n] \bmod p,$$

where n is a natural number, p is a prime number, and v is an associated primitive root, by the use of:

$$M(n)=M(n-1)+v \text{ (if } M(n-1)+v<p\text{), or}$$

$$M(n)=M(n-1)+v-p \text{ (if } M(n-1)+v \geq p\text{);}$$

first storing means for storing values obtained by the calculating means into a memory;

reading means for reading the values stored in the memory by the first storing means;

interleaving means for interleaving the values read by the reading means; and second storing means for storing a numerical sequence obtained by interleaving by the interleaving means into a memory.

According to this invention, there is also provided an interleave parameter calculating method, comprising, in order to obtain a base sequence for intra-row permutation in a turbo code interleaver:

a calculating step of calculating M(n) represented by:

$$M(n)=[v \times n] \mod p,$$

where n is a natural number, p is a prime number, and v is an associated primitive root, by the use of:

$$M(n)=M(n-1)+v \text{(if } M(n-1)+v<p\text{), or}$$

$$M(n)=M(n-1)+v-p \text{(if } M(n-1)+v \geq p\text{);}$$

a first storing step of storing values obtained by the calculating step into a memory;

a reading step of reading the values stored in the memory by the first storing step;

an interleaving step of interleaving the values read by the reading step; and a second storing step of storing a numerical sequence obtained by interleaving by the interleaving step into a memory.

According to this invention, there is also provided an interleave parameter calculating program for making a computer execute, in order to obtain a base sequence for intra-row permutation in a turbo code interleaver:

a calculating operation of calculating M(n) represented by;

$$M(n)=[v \times n] \mod p,$$

where n is a natural number, p is a prime number, and v is an associated primitive root, by the use of:

$$M(n)=M(n-1)+v \text{(if } M(n-1)+v<p\text{), or}$$

$$M(n)=M(n-1)+v-p \text{(if } M(n-1)+v \geq p\text{);}$$

a first storing operation of storing values obtained by the calculating operation into a memory;

a reading operation of reading the values stored in the memory by the first storing operation;

an interleaving operation of interleaving the values read by the reading operation; and a second storing operation of storing a numerical sequence obtained by interleaving by the interleaving operation into a memory.

According to this invention, it is possible to obtain a base sequence without carrying out modulo calculation. Therefore, the amount of calculation is reduced and the speed of calculation is increased. Further, a circuit for modulo calculation is unnecessary. Therefore, a circuit scale is reduced and a cost is lowered.

DESCRIPTION OF THE PREFERRED EMBODIMENTS

At first, a principle characterizing this invention will be described.

For all values of n (0, 1, ..., p−1), M(n) is calculated as:

$$M(n)=[v \times n] \mod p$$

In order to help understanding of formula transformation, M(n) is rewritten by the use of:

$$a(n)=\text{floor}([v \times n]/p)$$

Then, M(n) is given by:

$$M(n) = [v \times n] \mod p$$
$$= [v \times [n-1] - a(n-1) \times p + v] \mod p$$
$$= [M(n-1) + v] \mod p,$$

where the floor ( ) function is for truncating the decimal value.

According to the definition of 3GPP, v<p. Therefore, the following relationship is established.

$$M(n-1)+v<M(n-1)+p<2 \times p$$

Therefore, M(n) is represented by Equation (1). By calculating Equation (1) sequentially from n=1, M(n) can be calculated without requiring modulo calculation.

$$M(n) = \begin{cases} M(n-1) + v & \text{(if } M(n-1)+v<p\text{)} \\ M(n-1) + V - p & \text{(if } M(n-1)+v \geq p\text{)} \end{cases} \quad (1)$$

$$n = 2, 3, \ldots, (p-2) \text{ and } M(1) = v$$

Using M(n), S(j) is represented by:

$$S(j) = [v \times S(j-1)] \mod p$$
$$= M(S(j-1))$$

Thus, S(j) can be calculated without requiring modulo calculation.

Now, description will be made of a process and an apparatus for realizing a method of calculating a base sequence without requiring modulo calculation according to the above-mentioned principle.

First Embodiment

Figure 1:
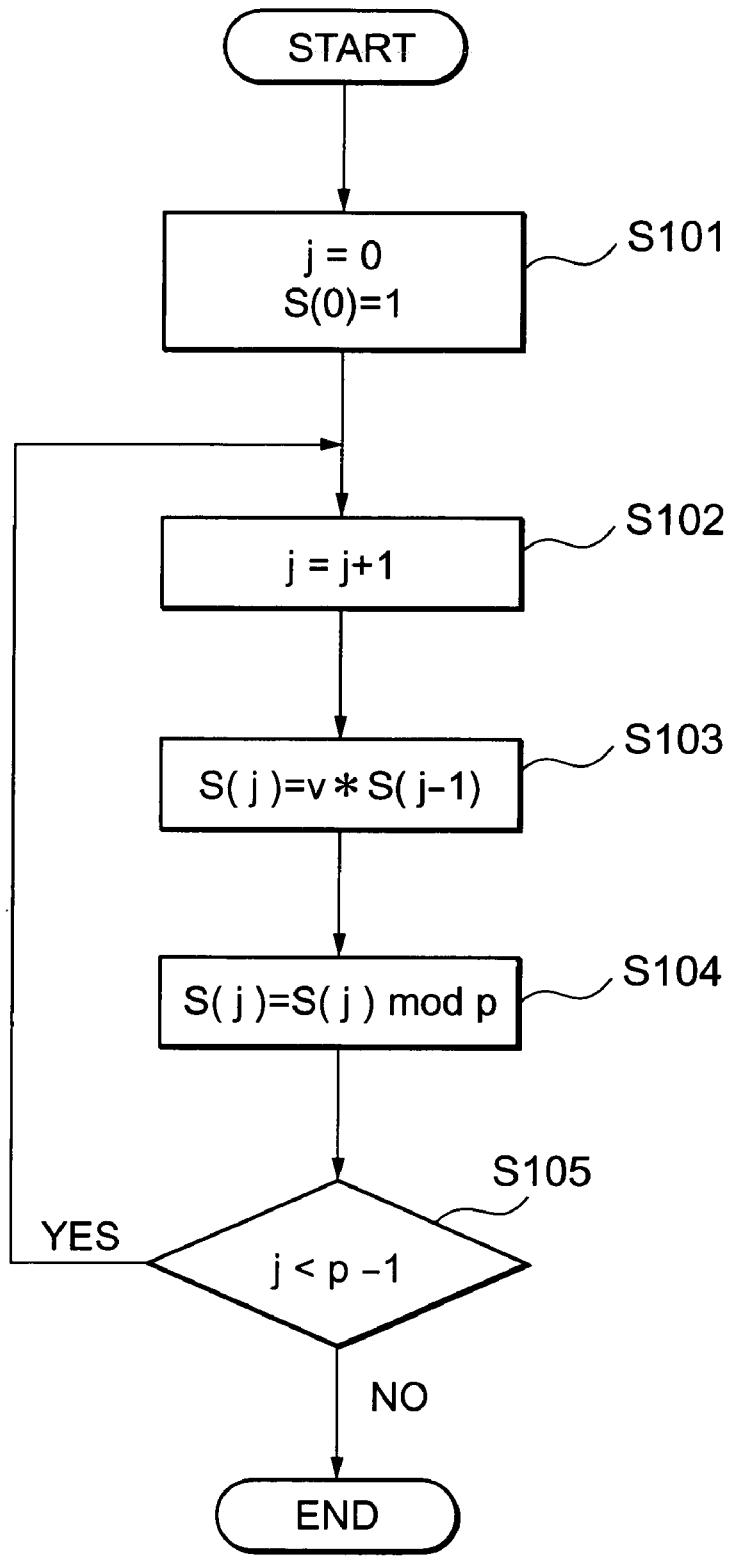
FIG. 1 is a flow chart for describing calculation of a base sequence S(j) according to a conventional method.
Figure 2:
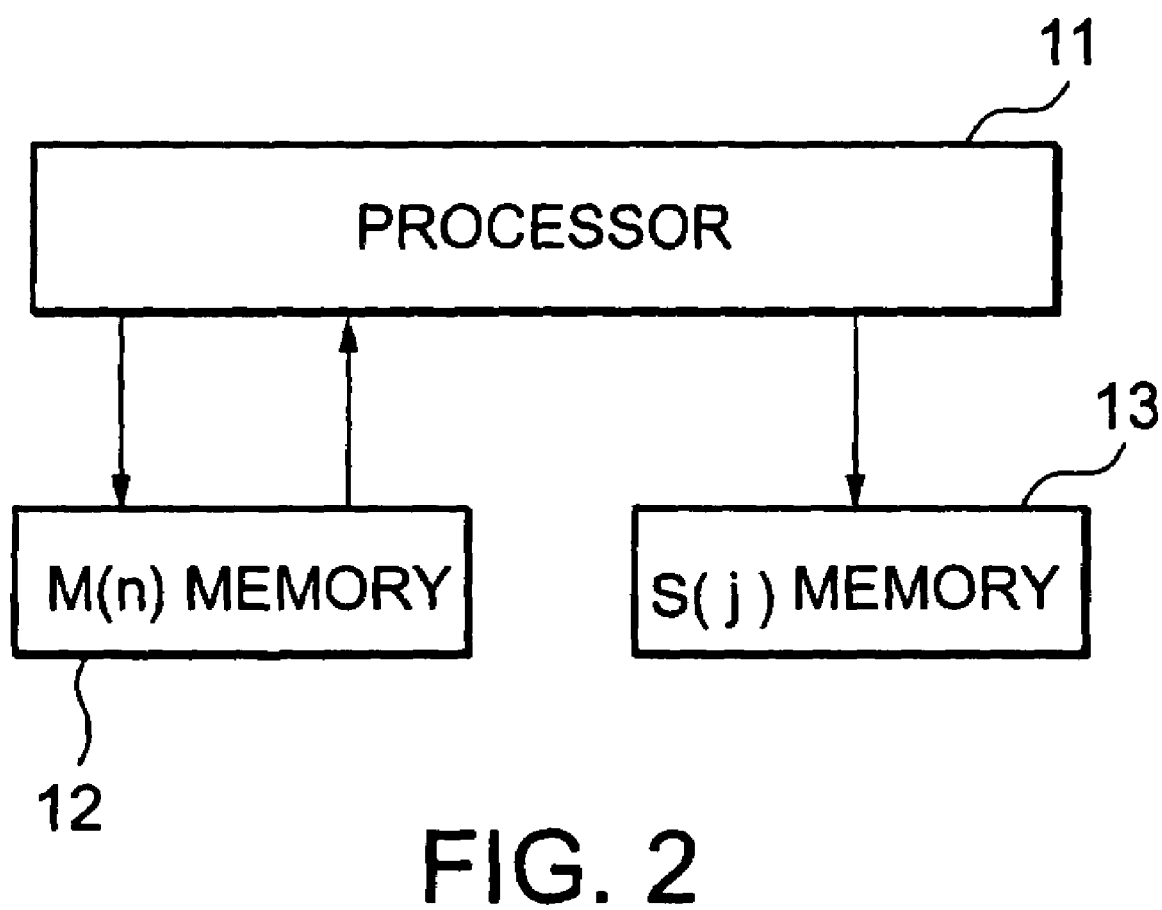
FIG. 2 is a block diagram showing a structure according to a first embodiment of this invention.

Referring to FIG. 2, a processor 11 calculates M(n) and S(j). A M(n) memory 12 stores M(n) calculated by the processor 11. A S(j) memory 13 stores S(j) calculated by the processor 11.

Figure 3:
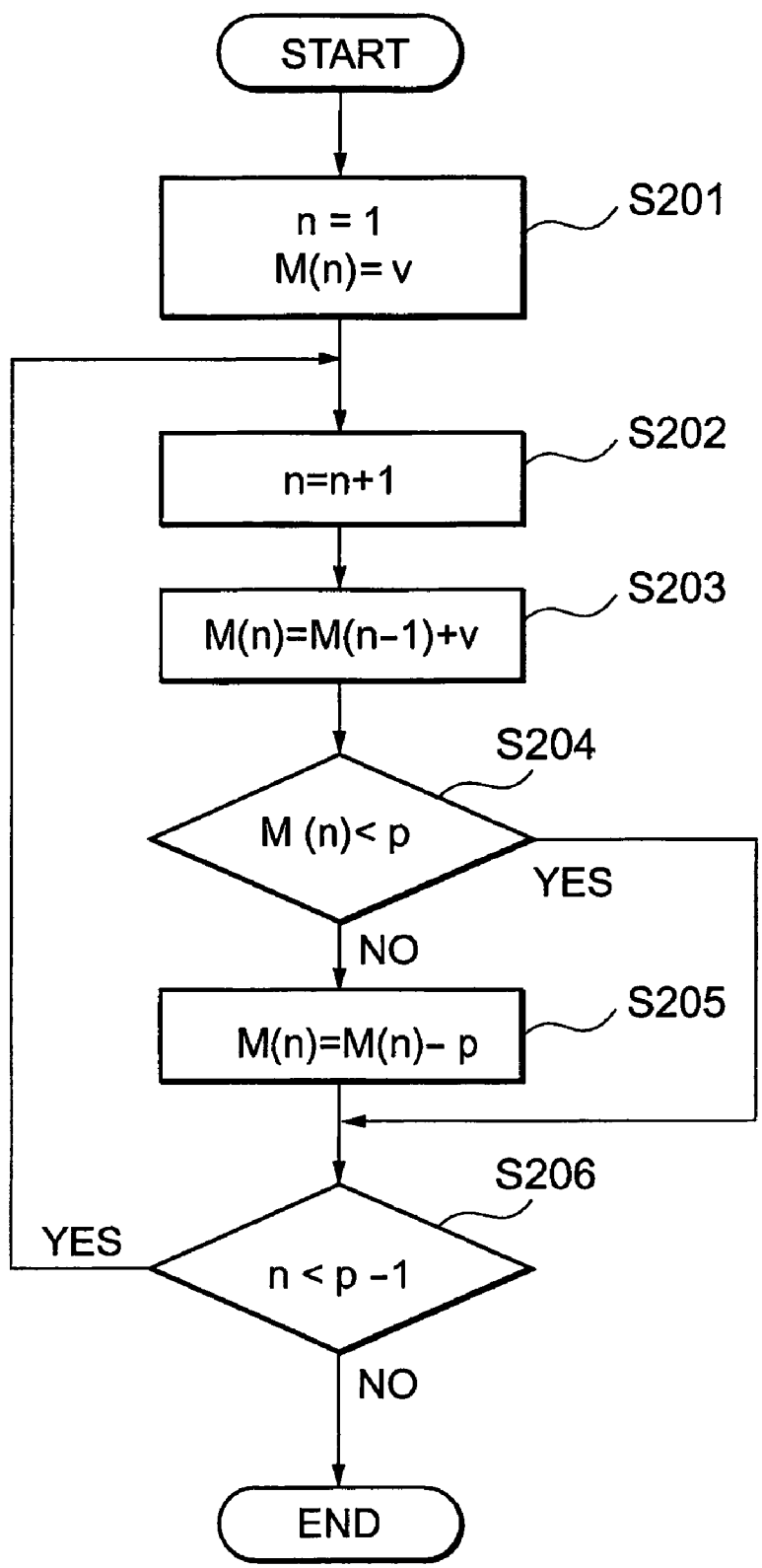
FIG. 3 is a flow chart for describing calculation of M(n)

At first, the processor 11 calculates M(n). Referring to FIG. 3, a calculation process will be described. M(n) is initialized and calculated (steps S201 to S203). According to Equation (1), case classification is carried out (step S204). If M(n)≧p, M(n) is given a value of M(n)−p (step S205). A loop of the steps S202 to S205 is repeated while n<(p−1) (YES in step S206). If n=(p−1) (NO in step S206), the loop is terminated. The result of calculation of M(n) is stored in the M(n) memory 12.

Figure 4:
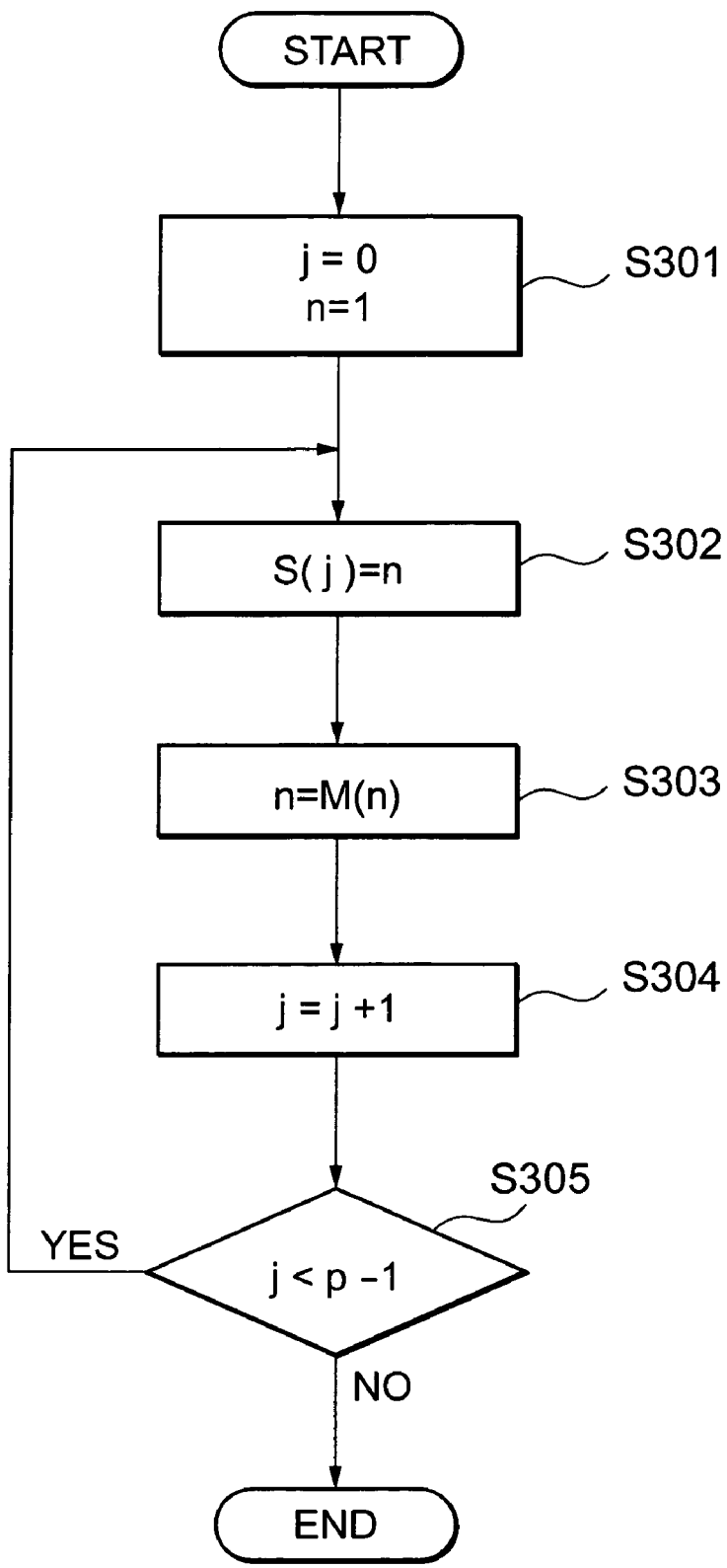
FIG. 4 is a flow chart for describing an operation of reading M(n) from a memory.

Next referring to FIG. 4, the processor 11 sets initial values j=0 and n=1 (step S301). Thereafter, M(n) is read from the M(n) memory 12 according to S(j)=M(S(j−1)) (steps S302 to S305) and is stored in the S(j) memory 13. In this manner, S(j) is produced in the S(j) memory 13.

Herein, it is assumed that each of conditional branches (steps S204, S206, S305) requires two unit steps and each of the remaining steps (steps S202, S203, S205, S302 to S304) requires one unit step, like in the conventional method. Then, in this embodiment, 12 steps are required. Thus, the number of unit steps as the amount of processing is reduced. Since the prime number p has a maximum value of 257, it is possible to reduce the amount of processing by 2048 unit steps at maximum.

In case where Sm(j) is calculated, it is necessary to merely change setting of the initial values. Specifically, the initial value of n in FIG. 3 is given 0, M(n) in FIG. 3 is given (v−1). and the initial value of n in FIG. 4 is given 0. Thus, without increasing the number of unit steps, Sm(j) can be obtained.

Depending upon the number C of columns of the interleaver, a required base sequence is different and selected from S(j) and S(j)−1=Sm(j). The required base sequence (represented by Sf(j)) is given by Equation (2).

$$Sf(j) = \begin{cases} S(j) & (\text{if } C == p, p+1) \\ Sm(j) & (\text{if } C == p-1) \end{cases} \quad (2)$$
$$j = 0, 1, \ldots, p-2$$

Herein, S(j) and Sm(j) have maximum values 256 and 255 when p=257, respectively. In order to represent these values by binary numbers, 9 bits and 8 bits are required, respectively. When p=257, C=p−1. Therefore, Sf(j) is represented by 8 bits at maximum. Thus, by changing the initial values of M(0) and n to directly obtain Sf(j) depending upon the situation, the bit width of each of the M(n) and S(j) memories 12 and 13 can be reduced by 1 bit, as compared with the case where S(j) is calculated and then 1 is subtracted from S(j) depending upon the situation.

Further, the M(n) memory 12 is unnecessary during turbo coding and decoding. Therefore, it is possible to reduce the circuit scale by using the M(n) memory 12 as a memory of a turbo codec during turbo coding and decoding.

According to this embodiment, it is possible to decrease the number of unit steps of the process and to reduce an operation time of the processor. Further, by reducing the operation time of the processor, power consumption can be reduced.

Second Embodiment

Figure 5:
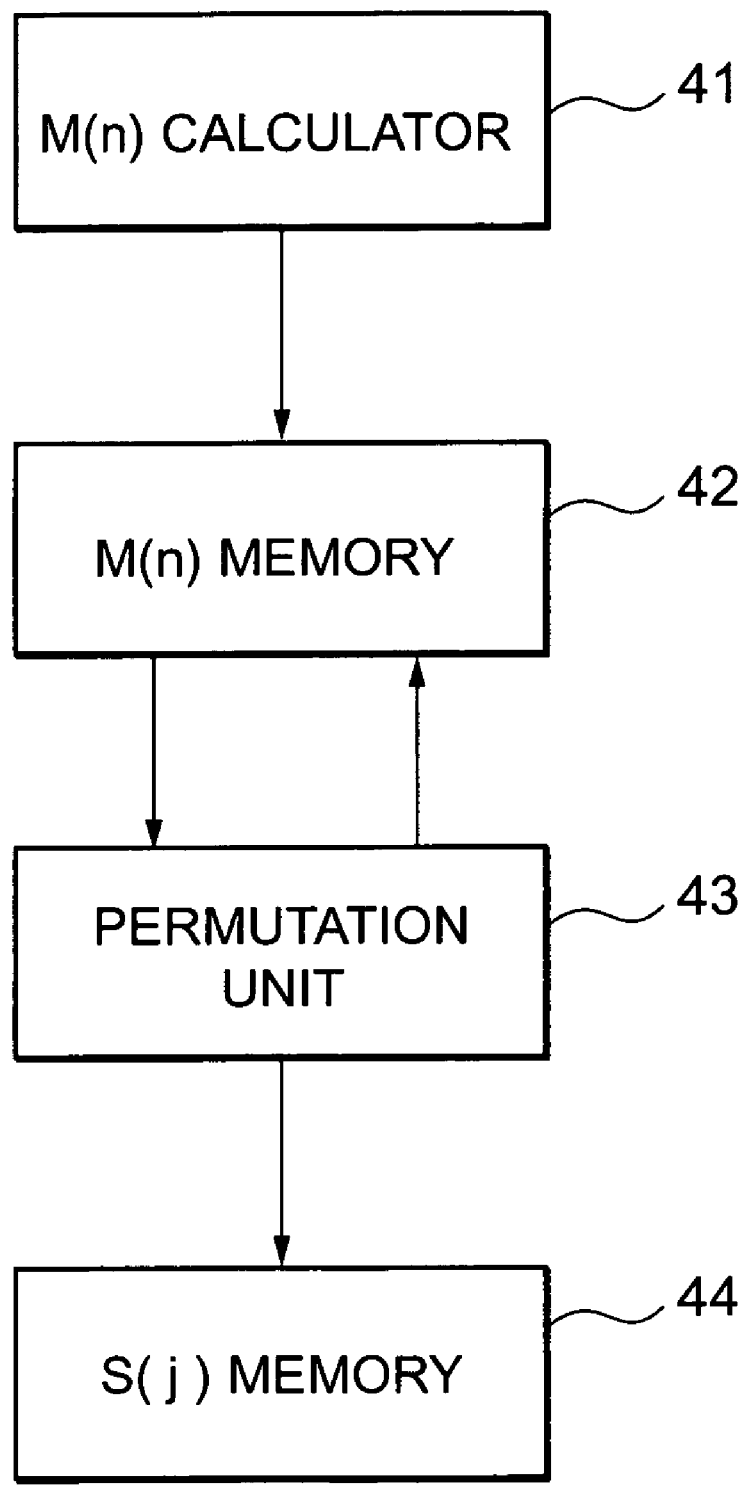
FIG. 5 is a block diagram showing a structure according to a second embodiment of this invention.

Referring to FIG. 5, a M(n) calculator 41 calculates M(n). A M(n) memory 42 stores M(n) calculated by the M(n) calculator 41. A permutation unit 43 interleaves M(n) to produce S(j). A S(j) memory 44 stores S(j) produced by the permutation unit 43.

Figure 6:
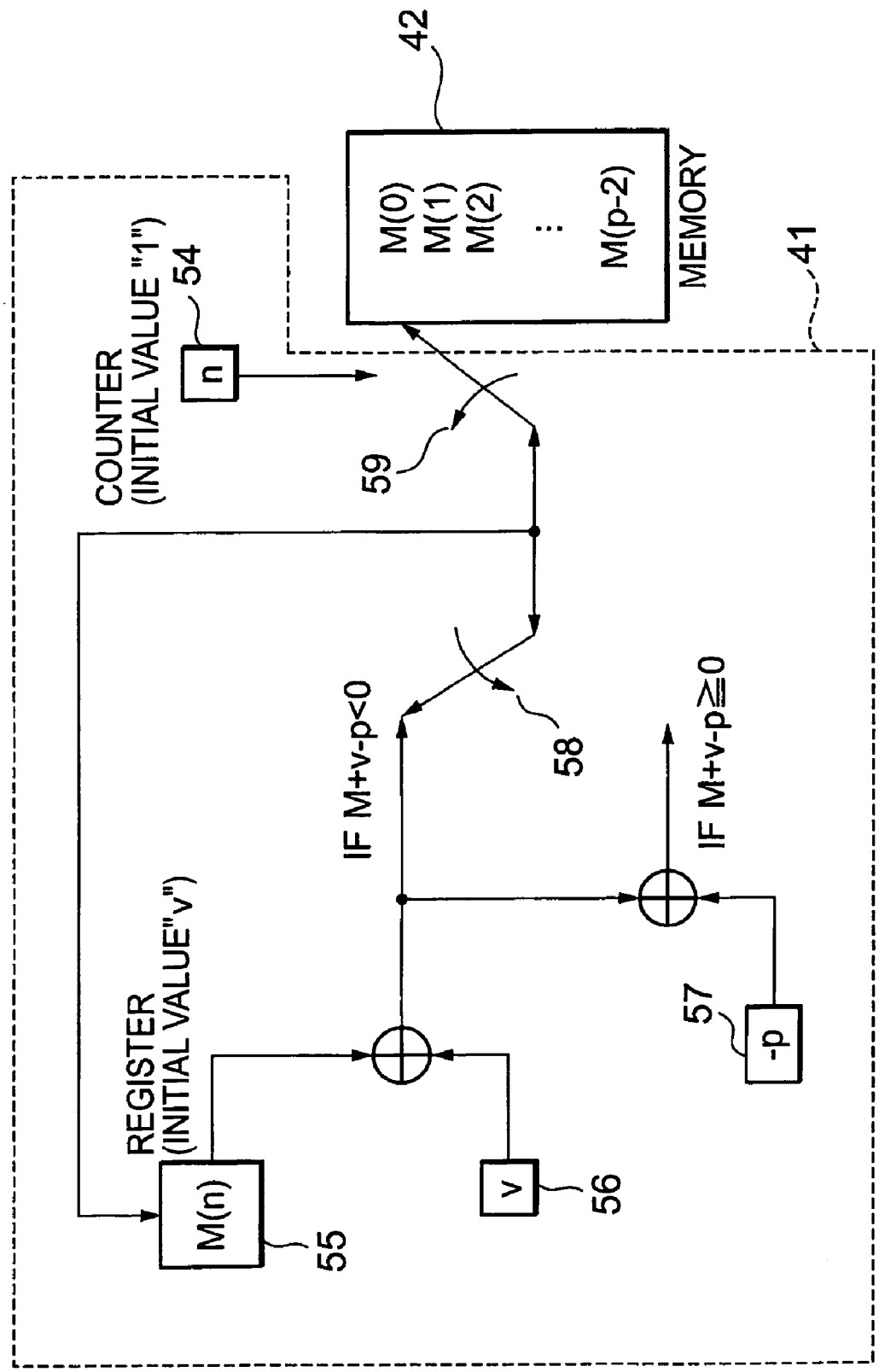
FIG. 6 is a block diagram for use in describing a M(n) calculator illustrated in FIG. 5.

Referring to FIG. 6, description will be made of the M(n) calculator 41.

The M(n) storage memory 42 is for storing a value of M(n).

A memory address producing counter 54 produces a store address where the value of M(n) is to be stored.

A register 55 has the value of M(n).

A constant block 56 has a value of v.

A constant block 57 has a value of −p.

A selector 58 selects an output value depending upon the value of M(n)−p.

A selector 59 selects the store address for the value of M(n).

Thus, the M(n) calculator 41 includes the memory address producing counter 54, the register 55, the constant block 56, the constant block 57, the selector 58, and the selector 59.

Figure 7:
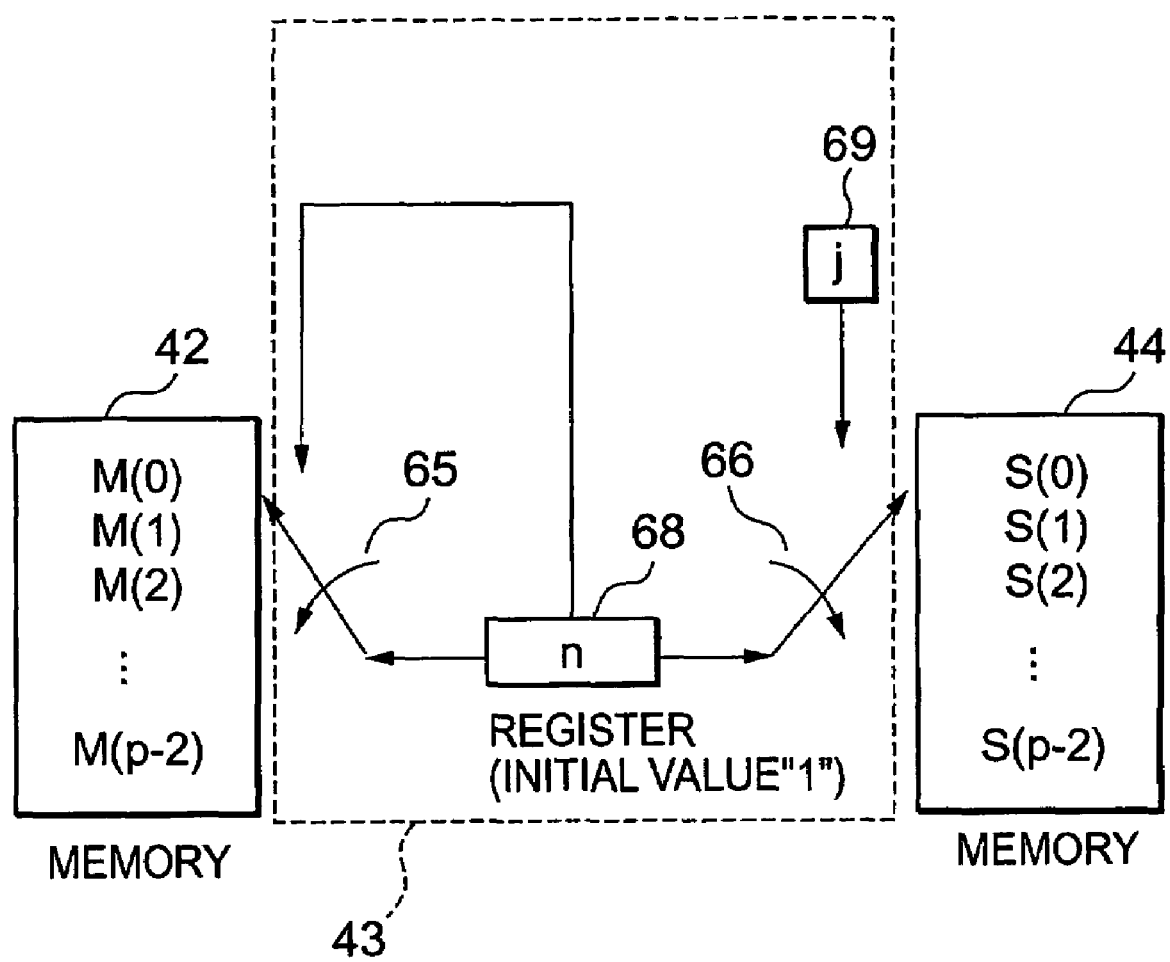
FIG. 7 is a block diagram for use in describing a permutation unit illustrated in FIG. 5.

Referring to FIG. 7, the permutation unit 43 will be described.

The M(n) memory 42 stores the value of M(n).

The S(j) memory 44 is for storing the value of S(j).

A selector 65 selects a read address of M(n).

A selector 66 selects a store address for S(j).

A register 68 has a value of the read address.

A counter 69 has a value of the store address.

Thus, the permutation unit 43 includes the selector 65, the selector 66, the register 68, and the counter 69.

Turning back to FIG. 6, a fundamental operation of the M(n) calculator 41 is similar to that described in conjunction with FIG. 3. The operation of the M(n) calculator 41 will be described in detail. At first, in an initial state, the register 55 and the counter 54 have initial values "v" and "1" as M(0) and n, respectively. The value of M(n) in the register 55 and the value of v in the constant block 56 are added and the value p of the constant block 57 is subtracted. If the result of the above-mentioned calculation has a negative value (M+v−p<0), a previous value (M+v) before subtraction is produced as the output value. Otherwise (M+v−0≧0), a subtracted value (M+v−p) is produced as the output value. The output value is stored in an address n of the memory 42. For next calculation, the output value is stored in the register 55 and the value n of the counter 54 is incremented by 1. The above-mentioned operation is repeated until the value n of the counter 54 is equal to p−2.

In FIG. 7, operation of the permutation unit 43 is started after completion of the above-mentioned operation of the M(n) calculator 41. A fundamental operation is similar to that described in conjunction with FIG. 4. The register 68 and the counter 69 holds "1" and "0" as initial values of n and j, respectively. The value n of the register 68 is stored in the address j of the memory 44. The value j of the counter 69 is incremented by 1. Subsequently, the value M(n) is read from an address n of the memory 42 and stored in the register 68. The above-mentioned operation is repeated until the value j of the counter 69 is equal top −1.

Thus, S(j) is produced in the S(j) memory 44.

In the manner similar to the first embodiment, Sm(j) can be obtained by setting "0" as the initial value of the register 55 in FIG. 6 and "1" as the initial value of the register 68 in FIG. 7. In the manner similar to the first embodiment, the M(n) and the S(j) memories 42 and 44 can be reduced in size by directly calculating Sf(j). Further, in the manner similar to the first embodiment, the memory 42 can be used as a memory of a turbo codec.

According to this embodiment, it is possible to reduce the circuit scale because a modulo calculator is not used. Further, since calculation of v×S(j) is not carried out and the maximum value is smaller than p×2, it is possible to reduce a calculation bit width.

If an interleave parameter calculating apparatus for carrying out the operation described in this embodiment is used as a mobile radio apparatus such as a mobile telephone, it is possible to reduce the size of a main body of the mobile radio apparatus.

According to this invention, a processor used in the mobile telephone is reduced in circuit scale so that the main body of the mobile telephone can be reduced in size.

While this invention has thus far been described in conjunction with the preferred embodiments thereof, it will readily be possible for those skilled in the art to put this invention into practice in various other manners.

What is claimed is:

1. A mobile telephone comprising, in order to obtain a base sequence for intra-row permutation in a turbo code interleaver:

calculating means for calculating M(n) represented by:

$$M(n)=[v \times n] \bmod p,$$

where n is a natural number, p is a prime number, and v is an associated primitive root, by the use of:

$$M(n)=M(n-1)+v (\text{if } M(n-1)+v<p), \text{ or}$$

$$M(n)=M(n-1)+v-p (\text{if } M(n-1)+v \geq p);$$

first storing means for storing values obtained by said calculating means into a first memory location;
reading means for reading the values stored in said first memory location by said first storing means;
interleaving means for interleaving the values read by said reading means; and
second storing means for storing a numerical sequence obtained by interleaving by said interleaving means into a second memory location.

2. A mobile telephone according to claim 1, wherein:
said interleaving means interleaves the values stored in said memory locations according to a numerical sequence defined by:

$$a_{n+1}=M(a_n).$$

3. A mobile telephone according to claim 2, further comprising:
means for determining values of a base sequence S(n) given by:

$$S(n)=[v \times S(n-1)] \bmod p,$$

by relating the base sequence S(n) and the numerical sequence obtained by said interleaving means to each other.

4. A mobile telephone according to claim 3, wherein a base sequence Sm(n) given by:

$$Sm(n)=S(n)-1$$

is calculated by giving S(0)−1 as an initial value of the base sequence S(n).

5. A mobile telephone according to claim 4, wherein an appropriate base sequence is selected from the base sequences S(n) and Sm(n) in dependence upon a number of columns of said interleaver.

6. An interleave parameter calculating apparatus comprising, in order to obtain a base sequence for intra-row permutation in a turbo code interleaver:
calculating means for calculating M(n) represented by:

$$M(n)[v \times n] \bmod p,$$

where n is a natural number, p is a prime number, and v is an associated primitive root, by the use of:

$$M(n)=M(n-1)+v (\text{if } M(n-1)+v<p), \text{or}$$

$$M(n)=M(n-1)+v-p (\text{if } M(n-1)+v \geq p);$$

first storing means for storing values obtained by said calculating means into a first memory location;
reading means for reading the values stored in said first memory location by said first storing means;
interleaving means for interleaving the values read by said reading means; and
second storing means for storing a numerical sequence obtained by interleaving by said interleaving means into a second memory location.

7. An interleave parameter calculating apparatus according to claim 6, wherein:
said interleaving means interleaves the values stored in said memory locations according to a numerical sequence defined by:

$$a_{n+1}=M(a_n).$$

8. An interleave parameter calculating apparatus according to claim 7, further comprising:
means for determining values of a base sequence S(n) given by:

$$S(n)=[v \times S(n-1)] \bmod p,$$

by relating the base sequence S(n) and the numerical sequence obtained by said interleaving means to each other.

9. An interleave parameter calculating apparatus according to claim 8, wherein a base sequence Sm(n) given by:

$$Sm(n)=S(n)-1$$

is calculated by giving S(0)−1 as an initial value of the base sequence S(n).

10. An interleave parameter calculating apparatus according to claim 9, wherein an appropriate base sequence is selected from the base sequences S(n) and Sm(n) in dependence upon a number of columns of said interleaver.

11. An interleave parameter calculating method, comprising, in order to obtain a base sequence for intra-row permutation in a turbo code interleaver:
a calculating step of calculating M(n) represented by:

$$M(n)=[v \times n] \bmod p,$$

where n is a natural number, p is a prime number, and v is an associated primitive root, by the use of:

$$M(n)=M(n-1)+v (\text{if } M(n-1)+v<p), \text{ or}$$

$$M(n)=M(n-1)+v-p (\text{if } M(n-1)+v \geq p);$$

a first storing step of storing values obtained by said calculating step into a first memory location;
a reading step of reading the values stored in said first memory location by said first storing step;
an interleaving step of interleaving the values read by said reading step; and
a second storing step of storing a numerical sequence obtained by interleaving by said interleaving step into a second memory location.

12. An interleave parameter calculating method according to claim 11, wherein:
said interleaving step interleaves the values stored in said memory locations according to a numerical sequence defined by:

$$a_{n+1}=M(a_n).$$

13. An interleave parameter calculating method according to claim 12, further comprising:

a step of determining values of a base sequence S(n) given by:

$$S(n)=[v \times S(n-1)] \bmod p,$$

by relating the base sequence S(n) and the numerical sequence obtained by said interleaving step to each other.

14. An interleave parameter calculating method according to claim 13, wherein a base sequence Sm(n) given by:

$$Sm(n)=S(n)-1$$

is calculated by giving S(0)−1 as an initial value of the base sequence S(n).

15. An interleave parameter calculating method according to claim 14, wherein an appropriate base sequence is selected from the base sequences S(n) and Sm(n) in dependence upon a number of columns of said interleaver.

16. A computerized process defined by a sequence of machine-readable instructions tangibly embodied in a machine-readable medium, said process comprising an interleave parameter calculating program for making a computer execute, in order to obtain a base sequence for intra-row permutation in a turbo code interleaver:

a calculating operation of calculating M(n) represented by:

$$M(n)=[v \times n] \bmod p,$$

where n is a natural number, p is a prime number, and v is an associated primitive root, by the use of:

$$M(n)=M(n-1)+v (\text{if } M(n-1)+v<p), \text{ or}$$

$$M(n)=M(n-1)+v-p (\text{if } M(n-1)+v \geq p);$$

a first storing operation of storing values obtained by said calculating operation into a first memory location;

a reading operation of reading the values stored in said first memory location by said first storing operation;

an interleaving operation of interleaving the values read by said reading operation; and a second storing operation of storing a numerical sequence obtained by interleaving by said interleaving operation into a second memory location.

17. An interleave parameter calculating program according to claim 16, wherein:

said interleaving operation interleaves the values stored in said memory locations according to a numerical sequence defined by:

$$a_{n+1}=M(a_n).$$

18. An interleave parameter calculating program according to claim 17, said program making said computer further execute:

an operation of determining values of a base sequence S(n) given by:

$$S(n)=[v \times S(n-1)] \bmod p,$$

by relating the base sequence S(n) and the numerical sequence obtained by said interleaving operation to each other.

19. An interleave parameter calculating program according to claim 18, wherein a base sequence Sm(n) given by:

$$Sm(n)=S(n)-1$$

is calculated by giving S(0)−1 as an initial value of the base sequence S(n).

20. An interleave parameter calculating program according to claim 19, wherein an appropriate base sequence is selected from the base sequences S(n) and Sm(n) in dependence upon a number of columns of said interleaver.

* * * * *